(12) United States Patent
Li et al.

(10) Patent No.: US 11,328,628 B2
(45) Date of Patent: May 10, 2022

(54) FLEXIBLE DISPLAY APPARATUS AND HARDNESS-ENHANCING LAYER FOR ENHANCING SURFACE HARDNESS AND MECHANICAL STRENGTH OF FLEXIBLE DISPLAY PANEL

(71) Applicant: BOE Technology Group Co., Ltd., Beijing (CN)

(72) Inventors: Yuanyuan Li, Beijing (CN); Junjie Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 364 days.

(21) Appl. No.: 16/490,413

(22) PCT Filed: Sep. 26, 2018

(86) PCT No.: PCT/CN2018/107597
§ 371 (c)(1),
(2) Date: Aug. 30, 2019

(87) PCT Pub. No.: WO2020/061808
PCT Pub. Date: Apr. 2, 2020

(65) Prior Publication Data
US 2022/0005383 A1    Jan. 6, 2022

(51) Int. Cl.
*G09F 9/30* (2006.01)
*H01L 27/32* (2006.01)
(Continued)

(52) U.S. Cl.
CPC ............ *G09F 9/301* (2013.01); *H01L 27/322* (2013.01); *H01L 51/0097* (2013.01);
(Continued)

(58) Field of Classification Search
CPC ............ H01L 51/0097; H01L 51/5237; H01L 51/524; H01L 51/5246; H01L 51/5253;
(Continued)

(56) References Cited

U.S. PATENT DOCUMENTS 10,367,173 B1 *   7/2019  Wu ................... H04M 1/0268
2015/0364718 A1 * 12/2015  Huang ............... H01L 51/5253
                                                        257/40
(Continued)

FOREIGN PATENT DOCUMENTS

CN          104600208 A        5/2015
CN          104851905 A        8/2015
(Continued)

OTHER PUBLICATIONS

International Search Report & Written Opinion dated Jun. 25, 2019, regarding PCT/CN2018/107597.
(Continued)

*Primary Examiner* — Jesse Y Miyoshi
(74) *Attorney, Agent, or Firm* — Intellectual Valley Law, P.C.

(57) ABSTRACT

The present application provides a flexible display apparatus. The flexible display apparatus includes a flexible display panel; and a hardness-enhancing layer on the flexible display panel, the hardness-enhancing layer for enhancing surface hardness and mechanical strength of the flexible display panel. The hardness-enhancing layer includes an inorganic material sublayer and a composite material sublayer, the composite material sublayer including a polymer matrix and an inorganic material dispersed in the polymer matrix.

10 Claims, 9 Drawing Sheets

(51) Int. Cl.
*H01L 51/52* (2006.01)
*H01L 51/00* (2006.01)

(52) U.S. Cl.
CPC ...... *H01L 51/5237* (2013.01); *H01L 51/5284* (2013.01); *H01L 2251/5338* (2013.01)

(58) Field of Classification Search
CPC ............ H01L 51/5256; H01L 51/5259; H01L 51/5268; H01L 2251/5338
See application file for complete search history.

(56) References Cited

U.S. PATENT DOCUMENTS

| | | | |
|---|---|---|---|
| 2016/0155967 A1* | 6/2016 | Lee | H01L 27/323 257/88 |
| 2016/0192483 A1 | 6/2016 | Shin et al. | |
| 2016/0202476 A1 | 7/2016 | Chong et al. | |
| 2016/0359132 A1 | 12/2016 | Sun | |
| 2017/0092897 A1 | 3/2017 | Liu | |
| 2018/0097197 A1* | 4/2018 | Han | G06F 1/1677 |
| 2019/0011954 A1 | 1/2019 | Chu et al. | |
| 2019/0140210 A1* | 5/2019 | Cheng | H01L 51/5253 |

FOREIGN PATENT DOCUMENTS

| | | | | |
|---|---|---|---|---|
| CN | 107415333 A | | 12/2017 | |
| CN | 107819004 A | | 3/2018 | |
| CN | 107919436 A | | 4/2018 | |
| CN | 107968154 | * | 4/2018 | ............. H01L 51/52 |
| CN | 107968154 A | | 4/2018 | |
| CN | 108463339 A | | 8/2018 | |
| EP | 3271301 A2 | | 1/2018 | |

OTHER PUBLICATIONS

First Office Action in the Chinese Patent Application No. 201880001469.3, dated Jul. 16, 2020; English translation attached.

* cited by examiner

FLEXIBLE DISPLAY APPARATUS AND HARDNESS-ENHANCING LAYER FOR ENHANCING SURFACE HARDNESS AND MECHANICAL STRENGTH OF FLEXIBLE DISPLAY PANEL

CROSS-REFERENCE TO RELATED APPLICATION

This application is a national stage application under 35 U.S.C. § 371 of International Application No. PCT/CN2018/107597, filed Sep. 26, 2018, the contents of which are incorporated by reference in the entirety.

TECHNICAL FIELD

The present invention relates to display technology, more particularly, to a flexible display apparatus and a hardness-enhancing layer for enhancing surface hardness and mechanical strength of a flexible display panel.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present invention provides a flexible display apparatus comprising a flexible display panel and a hardness-enhancing layer on the flexible display panel, the hardness-enhancing layer for enhancing surface hardness and mechanical strength of the flexible display panel; wherein the hardness-enhancing layer comprises an inorganic material sublayer and a composite material sublayer, the composite material sublayer comprising a polymer matrix and an inorganic material dispersed in the polymer matrix.

Optionally, the flexible display panel comprises a flexible base substrate; a plurality of light emitting elements on the flexible base substrate; and an encapsulating layer on a side of the plurality of light emitting elements distal to the flexible base substrate, and encapsulating each of the plurality of light emitting elements; wherein the hardness-enhancing layer is on a side of the encapsulating layer distal to the plurality of light emitting elements.

Optionally, each of the inorganic material sublayer and the inorganic material dispersed in the polymer matrix comprises silicon element.

Optionally, the inorganic material sublayer and the inorganic material dispersed in the polymer matrix comprise one or a combination of $SiO_x$, $SiO_xC_y$, $SiN_x$, and $SiO_xN_y$.

Optionally, the flexible display apparatus comprises one or more openings extending through at least a sublayer of the hardness-enhancing layer for reducing mechanical stress in the hardness-enhancing layer when the flexible display apparatus is bent.

Optionally, the flexible display panel is a foldable display panel configured to be folded along a folding axis; and the one or more openings are configured to reduce mechanical stress in the hardness-enhancing layer induced by folding the flexible display apparatus along the folding axis.

Optionally, the folding axis extends through a region having multiple ones of the one or more openings or a region having multiple ones of the one or more openings on both sides thereof.

Optionally, the one or more openings are arranged in a plurality of columns of openings; openings in each column of the plurality of columns of openings are consecutively arranged along an overall direction substantially parallel to the folding axis; and the openings in each column of the plurality of columns of openings have a misaligned arrangement so that not all of the openings in a respective one of the plurality of columns of openings are collinear along the overall direction.

Optionally, the one or more openings extend through all sublayers of the hardness-enhancing layer.

Optionally, the inorganic material sublayer and the composite material sublayer are laminated together.

Optionally, the hardness-enhancing layer comprises one or more first sublayers on the flexible display panel; a polymer material sublayer on a side of the one or more first sublayers distal to the flexible display panel; and one or more second sublayers on a side of the polymer material sublayer distal to the one or more first sublayers; wherein the one or more first sublayers comprises one or a combination of the inorganic material sublayer and the composite material sublayer; and the one or more second sublayers comprises one or a combination of a second inorganic material sublayer and a second composite material sublayer.

Optionally, the flexible display apparatus further comprises one or a combination of a touch electrode layer on a side of the encapsulating layer distal to the plurality of light emitting elements; a black matrix on a side of the touch electrode layer distal to the encapsulating layer; and a color filter on a side of the touch electrode layer distal to the encapsulating layer; wherein the hardness-enhancing layer is on a side of one or a combination of the touch electrode layer, the black matrix, and the color filter distal to the encapsulating layer.

Optionally, the hardness-enhancing layer has a pencil hardness greater than 7H.

Optionally, the flexible display apparatus further comprises a flexible cover glass on a side of the hardness-enhancing layer distal to the flexible display panel.

Optionally, the flexible display apparatus further comprises an optical clear resin layer between the flexible cover glass and the hardness-enhancing layer, the optical clear resin layer adhering the flexible cover glass onto a surface of the hardness-enhancing layer.

In another aspect, the present invention provides a hardness-enhancing layer for enhancing surface hardness and mechanical strength of a flexible display panel, comprising an inorganic material sublayer and a composite material sublayer, the composite material sublayer comprising a polymer matrix and an inorganic material dispersed in the polymer matrix; wherein the hardness-enhancing layer has a pencil hardness of greater than 7H.

Optionally, the hardness-enhancing layer comprises one or more openings extending through at least a sublayer of the hardness-enhancing layer for reducing mechanical stress in the hardness-enhancing layer when the hardness-enhancing layer is bent.

Optionally, the one or more openings are configured to reduce mechanical stress in the hardness-enhancing layer induced by folding the hardness-enhancing layer along a folding axis; and the folding axis extends through a region having multiple ones of the one or more openings or a region having multiple ones of the one or more openings on both sides thereof.

Optionally, the one or more openings are arranged in a plurality of columns of openings; and openings in each column of the plurality of columns of openings are consecutively arranged along an overall direction substantially parallel to the folding axis; and the openings in each column of the plurality of columns of openings have a misaligned arrangement so that not all of the openings in a respective one of the plurality of columns of openings are collinear along the overall direction.

Optionally, the one or more openings extend through all sublayers of the hardness-enhancing layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Currently, a flexible display apparatus uses a flexible cover glass made of a polymer material. The flexible cover glass are highly flexible, however, typically has a hardness lower than 7H. The surface of the flexible cover glass is prone to scratches and other damages. Accordingly, the present disclosure provides, inter alia, a flexible display apparatus and a hardness-enhancing layer for enhancing surface hardness and mechanical strength of a flexible display panel that substantially obviate one or more of the problems due to limitations and disadvantages of the related art. In one aspect, the present disclosure provides a flexible display apparatus. In some embodiments, the flexible display apparatus includes a flexible display panel; and a hardness-enhancing layer on the flexible display panel. Optionally, the hardness-enhancing layer having a pencil hardness of greater than 7H. Optionally, the hardness-enhancing layer includes an inorganic material sublayer and a composite material sublayer. Optionally, the composite material sublayer includes a polymer matrix and an inorganic material dispersed in the polymer matrix.

Figure 1:
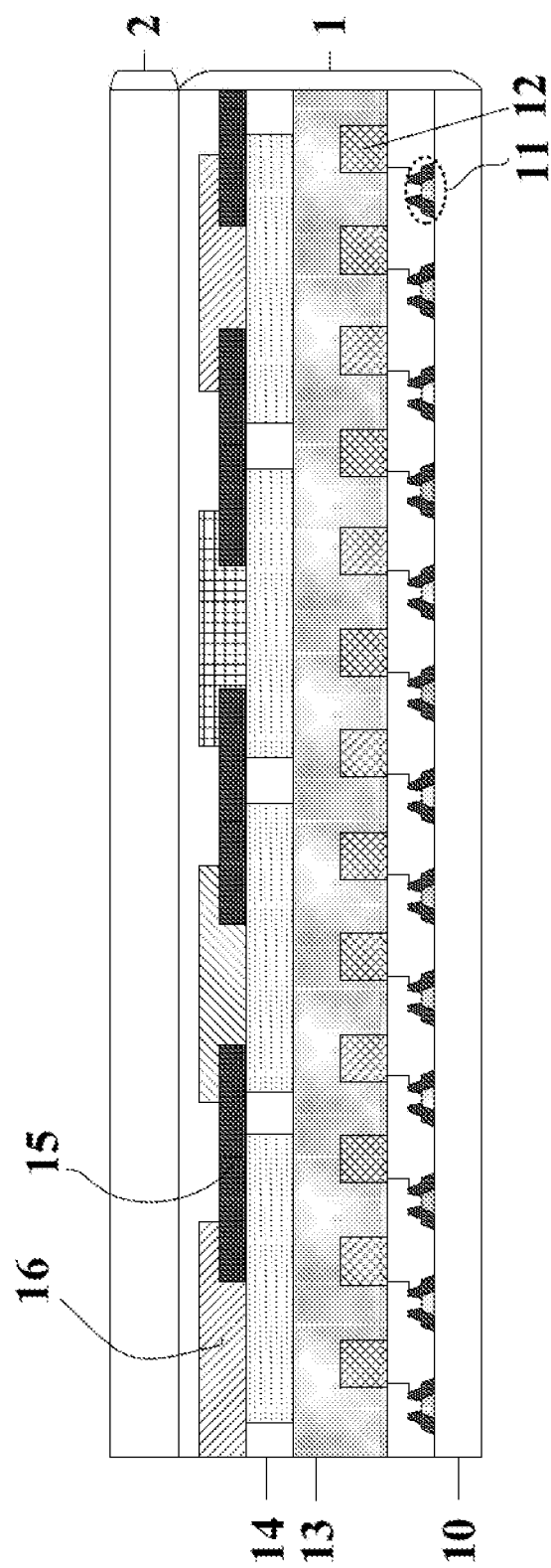
FIG. 1 is a schematic diagram illustrating the structure of a flexible display apparatus in some embodiments according to the present disclosure.

FIG. 1 is a schematic diagram illustrating the structure of a flexible display apparatus in some embodiments according to the present disclosure. Referring to FIG. 1, the flexible display apparatus in some embodiments includes a flexible display panel 1 and a hardness-enhancing layer 2 on the flexible display panel 1. In the present flexible display apparatus, the hardness-enhancing layer 2 has a pencil hardness of greater than 7H, e.g., equal to or greater than 8H, 7H to 8H, 8H to 9H. Optionally, the hardness-enhancing layer 2 has a pencil hardness of 9H. The hardness-enhancing layer 2 enhances the surface hardness of the flexible display apparatus as a whole. Optionally, the flexible display apparatus has an enhanced surface hardness, e.g., a pencil hardness of greater than 7H, e.g., equal to or greater than 8H, 7H to 8H, 8H to 9H.

In some embodiments, the flexible display panel 1 includes a flexible base substrate 10; an array of a plurality of thin film transistor II for driving light emission of the flexible display panel 1; a plurality of light emitting elements 12 on the flexible base substrate 10; and an encapsulating layer 13 on a side of the plurality of light emitting elements 12 distal to the flexible base substrate 10, and encapsulating each of the plurality of light emitting elements 12. The encapsulating layer 13 optionally may include a plurality of sublayers, e.g., one or more inorganic sublayers and one or more organic sublayers. Optionally, the hardness-enhancing layer 2 is on a side of the encapsulating layer 13 distal to the plurality of light emitting elements 12.

In some embodiments, the flexible display apparatus further includes one or a combination of a touch electrode layer 14, a black matrix 15 and a color filter 16. Referring to FIG. 1, in some embodiments, the touch electrode layer 14 is on a side of the encapsulating layer 13 distal to the plurality of light emitting elements 12, the black matrix 15 and the color filter 16 are on a side of the touch electrode layer 14 distal to the encapsulating layer 13. Optionally, the hardness-enhancing layer 2 is on a side of one or a combination of the touch electrode layer 14, the black matrix 15, and the color filter 16 distal to the encapsulating layer 13.

Optionally, the hardness-enhancing layer 2 is directly formed on the flexible display panel 1, e.g., by depositing one or more coating materials on the flexible display panel 1 followed by patterning the coating material layer.

Figure 2:
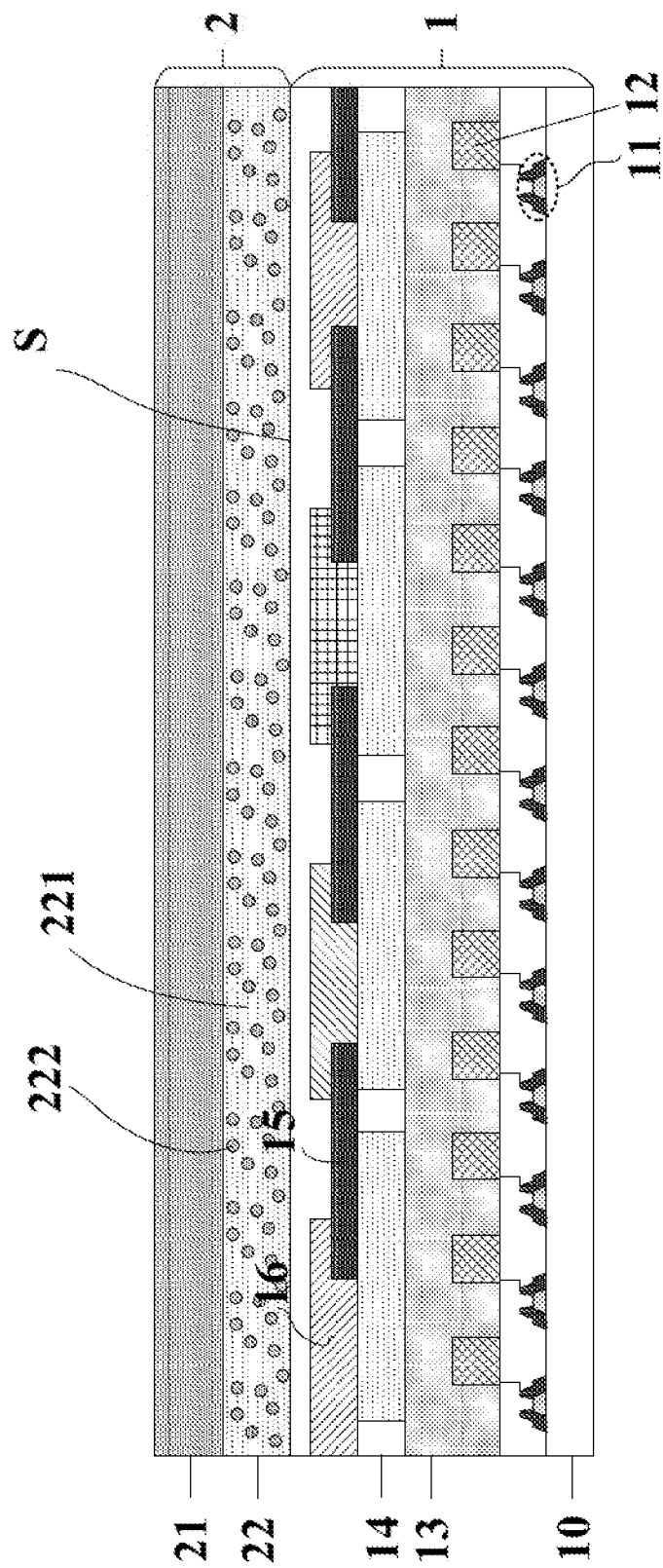
FIG. 2 is a schematic diagram illustrating the structure of a flexible display apparatus in some embodiments according to the present disclosure.

FIG. 2 is a schematic diagram illustrating the structure of a flexible display apparatus in some embodiments according to the present disclosure. Referring to FIG. 2, in some embodiments, the hardness-enhancing layer 2 includes an inorganic material sublayer 21 and a composite material sublayer 22. The composite material sublayer 22 includes a polymer matrix 221 and an inorganic material 222 dispersed in the polymer matrix 221. As used herein, the term "composite" refers to a material composed of at least a polymer material and an inorganic material. Optionally, the polymer material and the inorganic material remain distinct at the macroscopic or microscopic scale in the composite. In one example, the inorganic material 222 is dispersed in the polymer matrix 221 in form of inorganic material particles. Optionally, the composite is a nanocomposite in which the inorganic material 222 is dispersed in the polymer matrix 221 in form of inorganic material nanoparticles.

Various appropriate inorganic materials may be used for making the inorganic material sublayer 21 and the inorganic material 222 dispersed in the polymer matrix 221. For example, each of the inorganic material sublayer 21 and the inorganic material 222 dispersed in the polymer matrix 221 may include an inorganic material having a relatively high hardness (e.g., greater than 7H, greater than 8H, greater than 9H). In some embodiments, each of the inorganic material sublayer 21 and the inorganic material 222 dispersed in the polymer matrix 221 includes silicon element. Examples of silicon-containing inorganic materials suitable for making the inorganic material sublayer 21 and the inorganic material 222 dispersed in the polymer matrix 221 include one or a combination of $SiO_x$, $SiO_xC_y$, $SiN_x$, and $SiO_xN_y$. In some embodiments, each of the inorganic material sublayer 21 and the inorganic material 222 dispersed in the polymer matrix 221 includes a carbon-based inorganic material having a relatively high hardness, e.g., a graphene material.

Various appropriate polymer materials may be used for making the polymer matrix 221 of the composite material sublayer 22. For example, the polymer matrix 221 of the composite material sublayer 22 may include a polymer material having a relatively high flexibility and a relatively high hardness. Examples of appropriate polymer materials for making the polymer matrix 221 of the composite material sublayer 22 include polyimide, polycarbonate, polyethersulfone, polyethylene terephthalate, polyethylene naphthalate, polyarylate, and fiber-reinforced plastic.

Optionally, and referring to FIG. 2, the inorganic material sublayer 21 and the composite material sublayer 22 are laminated together.

Optionally, the hardness-enhancing layer 2 further includes another sublayer between the inorganic material sublayer 21 and the composite material sublayer 22.

Referring to FIG. 2, the inorganic material sublayer 21 in some embodiments is on a side of the composite material sublayer 22 distal to the encapsulating layer 13, thereby providing a hard surface for the flexible display apparatus. The presence of the composite material sublayer 22 underneath the inorganic material sublayer 21 provides a good flexibility to the flexible display apparatus when it is bent or folded.

Figure 3:
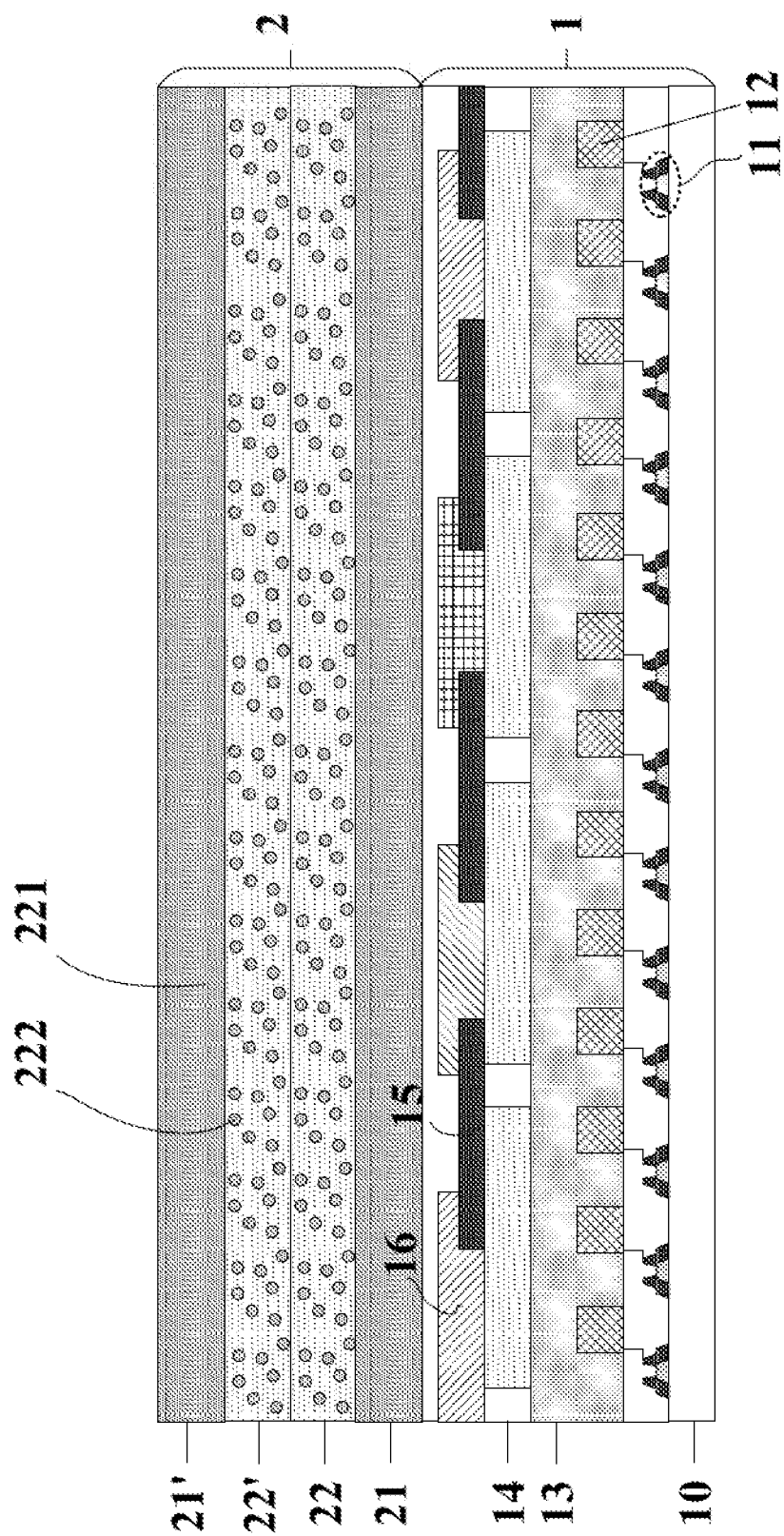
FIG. 3 is a schematic diagram illustrating the structure of a flexible display apparatus in some embodiments according to the present disclosure.

In some embodiments, the hardness-enhancing layer 2 has a multiple sublayer structure including a polymer material sublayer, one or more first sublayers on one side of the polymer material sublayer, and one or more second sublayers on an opposite side of the polymer material sublayer. FIG. 3 is a schematic diagram illustrating the structure of a flexible display apparatus in some embodiments according to the present disclosure. Referring to FIG. 3, the hardness-enhancing layer 2 includes one or more first sublayers on the flexible display panel 1; one or more second sublayers on a side of the one or more first sublayers distal to the flexible display panel 1. The one or more first sublayers include one or a combination of the inorganic material sublayer 21 and the composite material sublayer 22.

The one or more second sublayers include one or a combination of a second inorganic material sublayer 21' and a second composite material sublayer 22'. The second inorganic material sublayer 21' is similar to the inorganic material sublayer 21 in terms of their compositions, and the second composite material sublayer 22' is similar to the composite material sublayer 22 in terms of their compositions.

Figure 4:
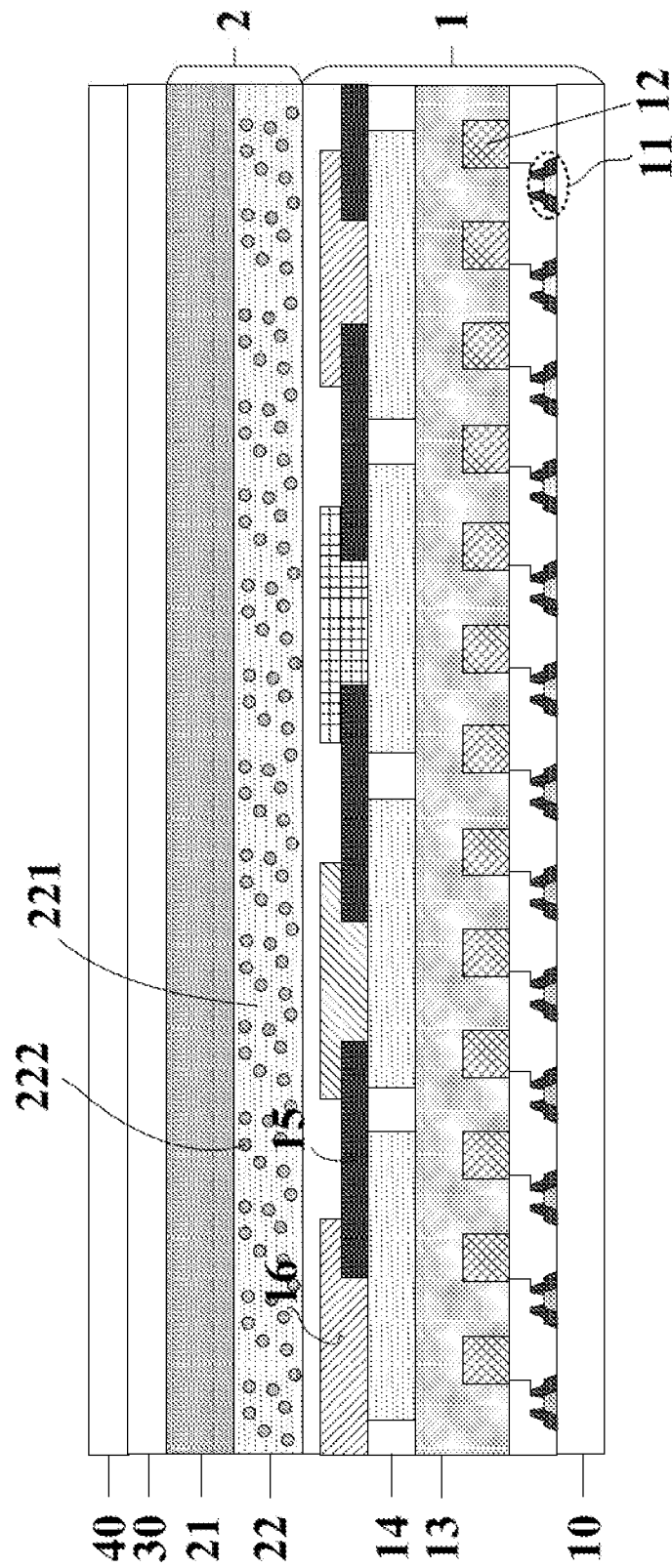
FIG. 4 is a schematic diagram illustrating the structure of a flexible display apparatus in some embodiments according to the present disclosure.

FIG. 4 is a schematic diagram illustrating the structure of a flexible display apparatus in some embodiments according to the present disclosure. Referring to FIG. 4, the flexible display apparatus in some embodiments further includes a flexible cover glass 40 on a side of the hardness-enhancing layer 2 distal to the flexible display panel 1. Optionally, the flexible display apparatus further includes an optical clear resin layer 30 between the flexible cover glass 40 and the hardness-enhancing layer 2, the optical clear resin layer 30 adhering the flexible cover glass 40 onto a surface of the hardness-enhancing layer 2.

Various appropriate polymer materials may be used for making the flexible cover glass 40. For example, the flexible cover glass 40 may include a polymer material having a relatively high flexibility and a relatively high hardness. Examples of appropriate polymer materials for making the flexible cover glass 40 include polyimide, polycarbonate, polyethersulfone, polyethylene terephthalate, polyethylene naphthalate, polyarylate, and fiber-reinforced plastic.

Figure 5:
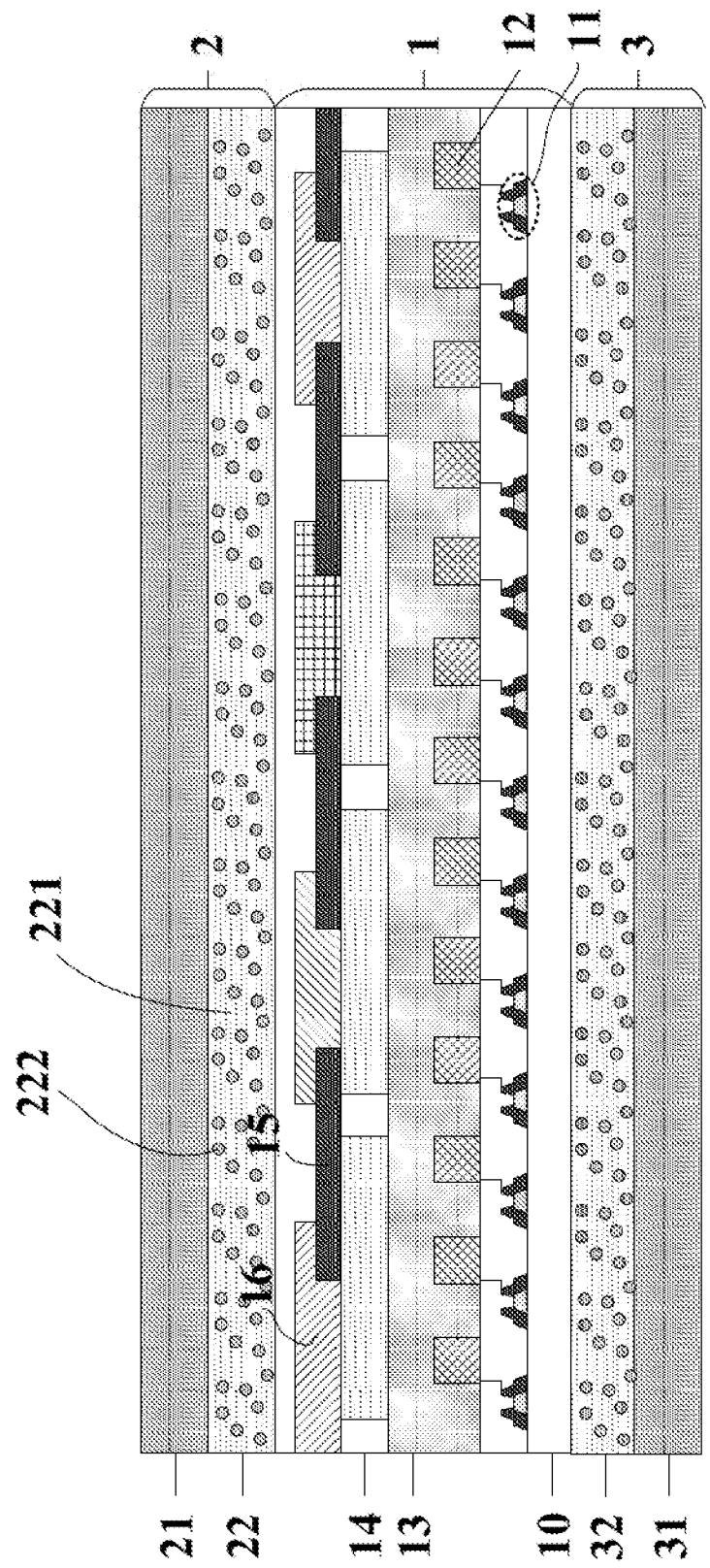
FIG. 5 is a schematic diagram illustrating the structure of a flexible display apparatus in some embodiments according to the present disclosure.

FIG. 5 is a schematic diagram illustrating the structure of a flexible display apparatus in some embodiments according to the present disclosure. Referring to FIG. 5, the flexible display apparatus in some embodiments further includes a second hardness-enhancing layer 3 on a side of the flexible display panel 1 distal to the hardness-enhancing layer 2. The second hardness-enhancing layer 3 may have a structure and composition similar to those of the hardness-enhancing layer 2. Optionally, the second hardness-enhancing layer 3 includes a third inorganic material sublayer 31 and a third composite material sublayer 32. Optionally, the third composite material sublayer 32 includes a polymer matrix and an inorganic material dispersed in the polymer matrix, similar to the composite material sublayer 22. The third inorganic material sublayer 31 includes an inorganic material having a relatively high hardness, similar to the inorganic material sublayer 21.

Figure 6:
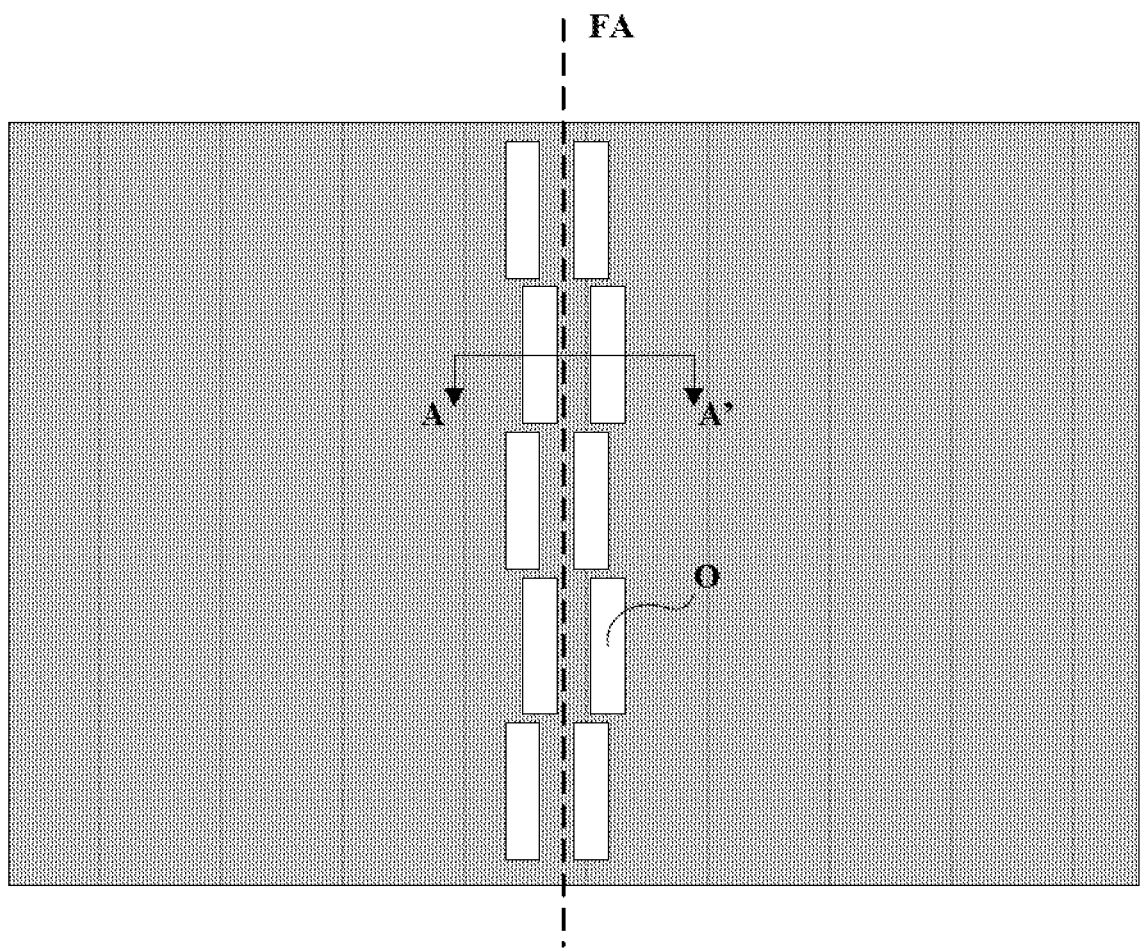
FIG. 6 is a plan view of a hardness-enhancing layer of a flexible display apparatus in some embodiments according to the present disclosure.

FIG. 6 is a plan view of a hardness-enhancing layer of a flexible display apparatus in some embodiments according to the present disclosure. Referring to FIG. 6, the flexible display apparatus in some embodiments includes one or more openings O for reducing mechanical stress in the hardness-enhancing layer when the flexible display apparatus is bent. The one or more openings O extend through at least a sublayer of the hardness-enhancing layer 2. For example, the flexible display panel in some embodiments is a foldable display panel configured to be folded along a folding axis FA. The one or more openings O are configured to reduce mechanical stress in the hardness-enhancing layer induced by folding the flexible display apparatus along the folding axis FA. Optionally, the folding axis FA extends through one or multiple ones of the one or more opening O. Optionally, the folding axis FA extends through a region having multiple ones of the one or more openings on both sides of the region.

Figure 7A:
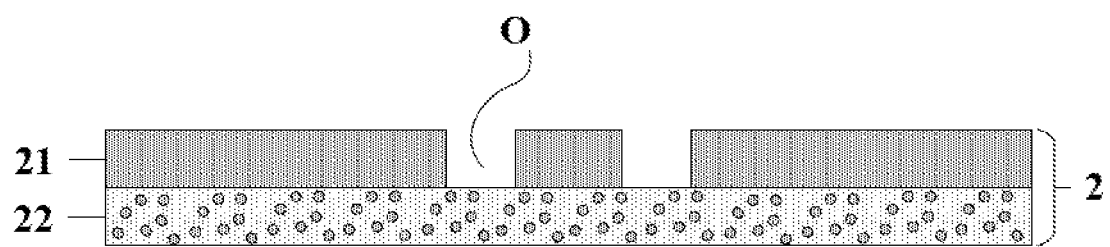
FIGS. 7A and 7B are cross-sectional views along a line A-A' in FIG. 6 in some embodiments according to the present disclosure.
Figure 7B:
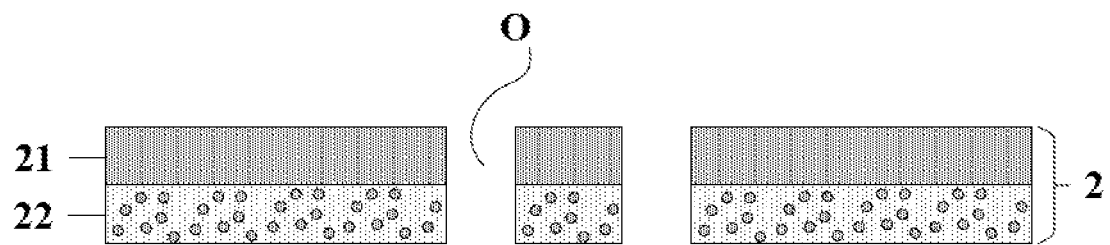

FIGS. 7A and 7B are cross-sectional views along a line A-A' in FIG. 6 in some embodiments according to the present disclosure. Referring to FIG. 7A, in some embodiments, the one or more openings O extend through only the inorganic material sublayer 21, but not the composite material sublayer 22. Referring to FIG. 7B, in some embodiments, the one or more openings O extend through all sublayers (including the inorganic material sublayer 21 and the composite material sublayer 22) of the hardness-enhancing layer 2.

Figure 8A:
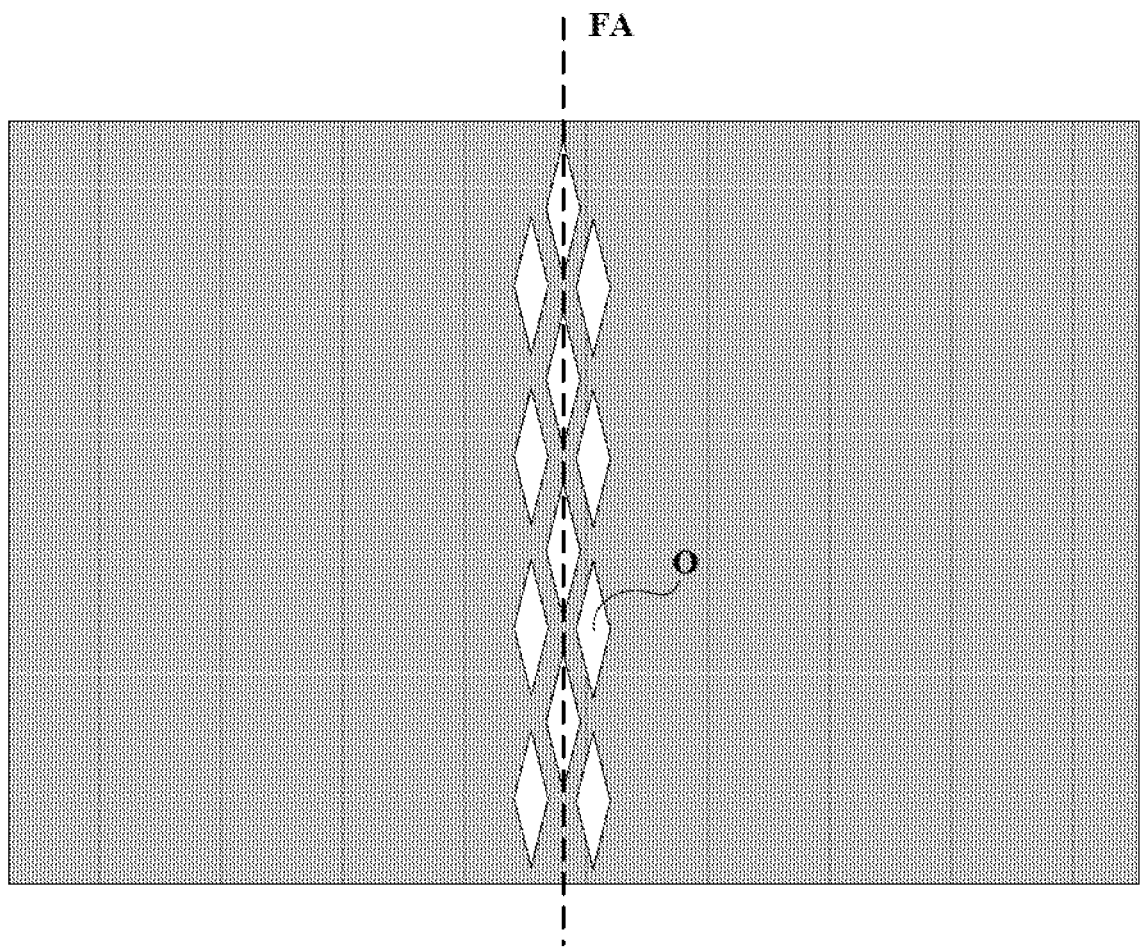
FIGS. 8A to 8D are schematic diagrams of flexible display apparatuses in some embodiments according to the present disclosure.
Figure 8B:
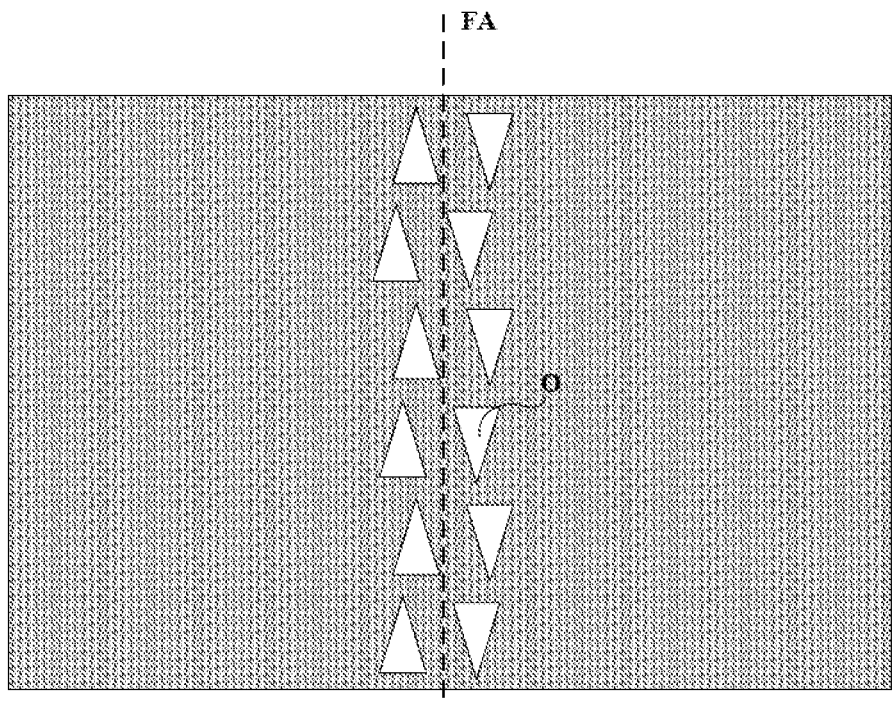
Figure 8C:
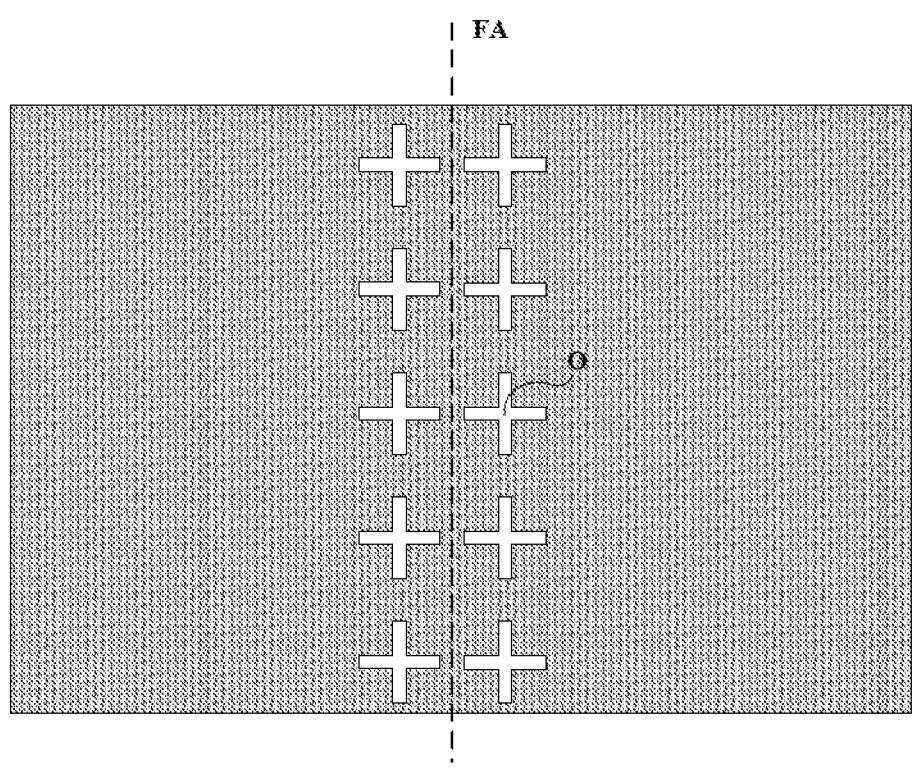

FIGS. 8A to 8D are schematic diagrams of flexible display apparatuses in some embodiments according to the present disclosure. Referring to FIG. 6 and FIGS. 8A to 8D, the one or more openings O can have various appropriate shapes and dimensions. Examples of appropriate shapes for the one or more openings O include a rectangular shape (FIG. 6), a parallelogram shape (FIG. 8A), a triangular shape (FIG. 8B), and a cross shape (FIG. 8C).

Figure 8D:
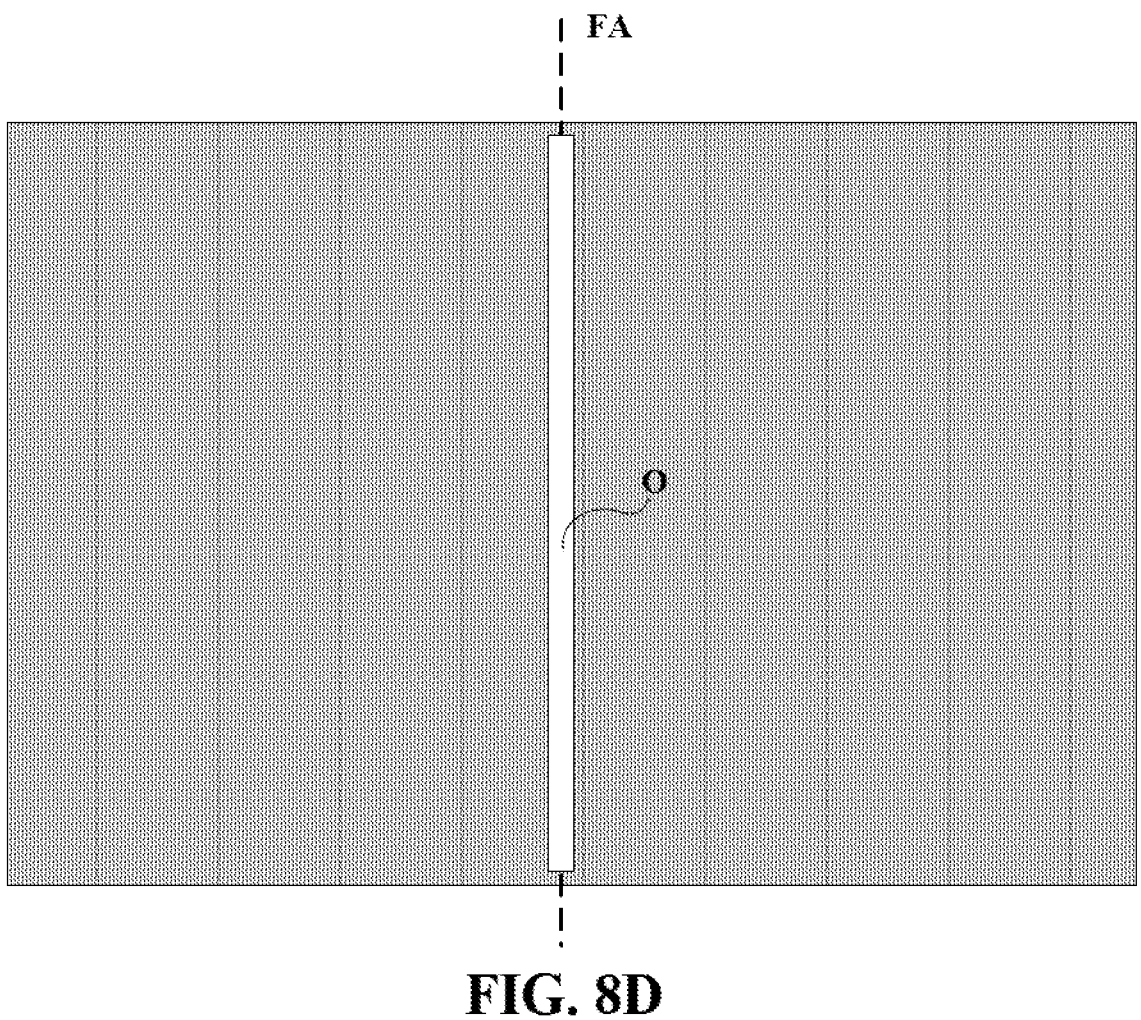

Referring to FIG. 6, FIG. 8B, and FIG. 8C, the folding axis FA in some embodiments extends through a region having multiple ones of the one or more openings O on both sides of the region. Referring to FIG. 8A, the folding axis FA in some embodiments extends through multiple ones of the one or more openings O. Referring to FIG. 8D, the flexible display apparatus in some embodiments includes a single opening extending through at least a sublayer of the hardness-enhancing layer 2, and the folding axis FA in some embodiments extends through the single opening.

Referring to FIG. 6, and FIGS. 8A to 8C, the one or more openings in some embodiments are arranged in a plurality of columns of openings. Optionally, openings in each column of the plurality of columns of openings are consecutively arranged along a direction substantially parallel to the folding axis FA. As used herein, the term "substantially parallel" means that an angle between two direction is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

In another aspect, the present disclosure provides a hardness-enhancing layer for enhancing surface hardness and mechanical strength of a flexible display panel. In some embodiments, the hardness-enhancing layer includes an inorganic material sublayer and a composite material sublayer. Optionally, the composite material sublayer includes a polymer matrix and an inorganic material dispersed in the polymer matrix. Optionally, the hardness-enhancing layer has a pencil hardness of greater than 7H, e.g., equal to or greater than 8H, 7H to 8H, 8H to 9H. Optionally, the hardness-enhancing layer 2 has a pencil hardness of 9H. Optionally, the inorganic material sublayer and the composite material sublayer are laminated together. Optionally, the hardness-enhancing layer further includes another sublayer between the inorganic material sublayer and the composite material sublayer.

In some embodiments, the hardness-enhancing layer has a multiple sublayer structure including a polymer material sublayer, one or more first sublayers on one side of the polymer material sublayer, and one or more second sublayers on an opposite side of the polymer material sublayer. Optionally, the hardness-enhancing layer includes one or more first sublayers on the flexible display panel; a polymer material sublayer on a side of the one or more first sublayers distal to the flexible display panel; and one or more second sublayers on a side of the polymer material sublayer distal to the one or more first sublayers. The one or more first sublayers include one or a combination of the inorganic material sublayer and the composite material sublayer. The one or more second sublayers include one or a combination of a second inorganic material sublayer and a second composite material sublayer. The second inorganic material sublayer is similar to the inorganic material sublayer in terms of their compositions, and the second composite material sublayer is similar to the composite material sublayer in terms of their compositions.

In some embodiments, the hardness-enhancing layer includes one or more openings for reducing mechanical stress in the hardness-enhancing layer when the hardness-enhancing layer is bent. The one or more openings extend through at least a sublayer of the hardness-enhancing layer. Optionally, the one or more openings are configured to reduce mechanical stress in the hardness-enhancing layer induced by folding the hardness-enhancing layer along a folding axis. Optionally, the folding axis extends through one or multiple ones of the one or more opening. Optionally, the folding axis extends through a region having multiple ones of the one or more openings on both sides of the region. The one or more openings can have various appropriate shapes and dimensions. Examples of appropriate shapes for the one or more openings include a rectangular shape, a parallelogram shape, a triangular shape, and a cross shape.

In some embodiments, the one or more openings extend through only the inorganic material sublayer, but not the composite material sublayer. In some embodiments, the one or more openings extend through all sublayers (including the inorganic material sublayer and the composite material sublayer) of the hardness-enhancing layer.

In some embodiments, the one or more openings are arranged in a plurality of columns of openings. Optionally, openings in each column of the plurality of columns of openings are consecutively arranged along a direction substantially parallel to the folding axis. Referring to FIG. 6 and FIG. 8B, in some embodiments, the openings in each column of the plurality of columns of openings have a misaligned arrangement so that not all of the openings in a respective one of the plurality of columns of openings are collinear along the overall direction. In one example, the openings in the respective one of the plurality of columns of openings have a zig-zag arrangement. Optionally, each of the one or more openings has an elongated shape, a longitudinal central axis of each of the one or more openings is substantially parallel to the overall direction, e.g., substantially parallel to the folding axis. Optionally, longitudinal central axes of the openings in each column of the plurality of columns of openings are not all collinear.

In another aspect, the present disclosure provides a method of fabricating a flexible display apparatus. In some embodiments, the method includes forming a hardness-enhancing layer having a pencil hardness of greater than 7H on a flexible display panel.

In some embodiments, the step of forming the flexible display panel includes forming an array of a plurality of thin film transistor on a flexible base substrate for driving light emission of the flexible display panel; forming a plurality of light emitting elements on the flexible base substrate; and forming an encapsulating layer on a side of the plurality of light emitting elements distal to the flexible base substrate to encapsulate each of the plurality of light emitting elements. Optionally, the hardness-enhancing layer is formed on a side of the encapsulating layer distal to the plurality of light emitting elements.

In some embodiments, the method further includes forming one or a combination of a touch electrode layer, a black matrix and a color filter. In some embodiments, the touch electrode layer is formed on a side of the encapsulating layer distal to the plurality of light emitting elements, the black matrix and the color filter are formed on a side of the touch electrode layer distal to the encapsulating layer. Optionally, the hardness-enhancing layer is formed on a side of one or a combination of the touch electrode layer, the black matrix, and the color filter distal to the encapsulating layer.

Optionally, the hardness-enhancing layer is directly formed on the flexible display panel, e.g., by depositing one or more coating materials on the flexible display panel followed by patterning the coating material layer.

In some embodiments, the step of forming the hardness-enhancing layer includes forming an inorganic material sublayer and a composite material sublayer. The step of forming the composite material sublayer includes dispersing an inorganic material in a polymer matrix. Optionally, the inorganic material sublayer and the composite material sublayer are formed to be laminated together. Optionally, the step of forming the hardness-enhancing layer further includes forming another sublayer between the inorganic material sublayer and the composite material sublayer. Optionally, the inorganic material sublayer is formed on a side of the composite material sublayer distal to the encapsulating layer, thereby providing a hard surface for the flexible display apparatus.

In some embodiments, the step of forming the hardness-enhancing layer further includes forming one or more openings extending through at least a sublayer of the hardness-enhancing layer. For example, the flexible display panel in some embodiments is a foldable display panel configured to be folded along a folding axis. Optionally, the one or more openings are formed so that the folding axis extends through one or multiple ones of the one or more opening. Optionally, the one or more openings are formed so that the folding axis extends through a region having multiple ones of the one or more openings on both sides of the region.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flexible display apparatus, comprising:
a flexible display panel; and
a hardness-enhancing layer on the flexible display panel, the hardness-enhancing layer for enhancing surface hardness and mechanical strength of the flexible display panel;
wherein the hardness-enhancing layer comprises an inorganic material sublayer and a composite material sublayer, the composite material sublayer comprising a polymer matrix and an inorganic material dispersed in the polymer matrix;
wherein the flexible display apparatus further comprises one or more openings extending through at least the inorganic material sublayer of the hardness-enhancing layer for reducing mechanical stress in the hardness-enhancing layer when the flexible display apparatus is bent;
the flexible display panel is a foldable display panel configured to be folded along a folding axis;
the one or more openings are configured to reduce mechanical stress in the hardness-enhancing layer induced by folding the flexible display apparatus along the folding axis;
the folding axis extends through a region having multiple ones of the one or more openings or a region having multiple ones of the one or more openings on both sides thereof;
the one or more openings are arranged in a plurality of columns of openings;
openings in each column of the plurality of columns of openings are consecutively arranged along an overall direction substantially parallel to the folding axis; and
the openings in each column of the plurality of columns of openings have a misaligned arrangement so that not all of the openings in a respective one of the plurality of columns of openings are collinear along the overall direction.

2. The flexible display apparatus of claim 1, wherein the flexible display panel comprises:
a flexible base substrate;
a plurality of light emitting elements on the flexible base substrate; and
an encapsulating layer on a side of the plurality of light emitting elements distal to the flexible base substrate, and encapsulating each of the plurality of light emitting elements;
wherein the hardness-enhancing layer is on a side of the encapsulating layer distal to the plurality of light emitting elements.

3. The flexible display apparatus of claim 1, wherein each of the inorganic material sublayer and the inorganic material dispersed in the polymer matrix comprises silicon element.

4. The flexible display apparatus of claim 3, wherein the inorganic material sublayer and the inorganic material dispersed in the polymer matrix comprise one or a combination of $SiO_x$, $SiO_xC_y$, $SiN_x$, and $SiO_xN_y$.

5. The flexible display apparatus of claim 2, further comprising one or a combination of:
a touch electrode layer on a side of the encapsulating layer distal to the plurality of light emitting elements;
a black matrix on a side of the touch electrode layer distal to the encapsulating layer; and
a color filter on a side of the touch electrode layer distal to the encapsulating layer;

wherein the hardness-enhancing layer is on a side of one or a combination of the touch electrode layer, the black matrix, and the color filter distal to the encapsulating layer.

6. The flexible display apparatus of claim 1, wherein the inorganic material sublayer and the composite material sublayer are laminated together.

7. The flexible display apparatus of claim 1, wherein the hardness-enhancing layer has a pencil hardness greater than 7H.

8. The flexible display apparatus of claim 1, further comprising a flexible cover glass on a side of the hardness-enhancing layer distal to the flexible display panel.

9. The flexible display apparatus of claim 8, further comprising an optical clear resin layer between the flexible cover glass and the hardness-enhancing layer, the optical clear resin layer adhering the flexible cover glass onto a surface of the hardness-enhancing layer.

10. A hardness-enhancing layer for enhancing surface hardness and mechanical strength of a flexible display panel, comprising an inorganic material sublayer and a composite material sublayer, the composite material sublayer comprising a polymer matrix and an inorganic material dispersed in the polymer matrix;

wherein the hardness-enhancing layer has a pencil hardness of greater than 7H;

wherein the hardness-enhancing layer further comprises one or more openings extending through at least the inorganic material sublayer of the hardness-enhancing layer for reducing mechanical stress in the hardness-enhancing layer when the hardness-enhancing layer is bent;

the one or more openings are configured to reduce mechanical stress in the hardness-enhancing layer induced by folding the hardness-enhancing layer along a folding axis;

the folding axis extends through a region having multiple ones of the one or more openings or a region having multiple ones of the one or more openings on both sides thereof the one or more openings are arranged in a plurality of columns of openings;

openings in each column of the plurality of columns of openings are consecutively arranged along an overall direction substantially parallel to the folding axis; and the openings in each column of the plurality of columns of openings have a misaligned arrangement so that not all of the openings in a respective one of the plurality of columns of openings are collinear along the overall direction.

* * * * *